United States Patent

Russell et al.

[15] 3,676,742

[45] July 11, 1972

[54] MEANS INCLUDING A SPARK GAP FOR PROTECTING AN INTEGRATED CIRCUIT FROM ELECTRICAL DISCHARGE

[72] Inventors: Lewis K. Russell, San Jose; James L. Banks, Santa Clara, both of Calif.

[73] Assignee: Signetics Corporation, Sunnyvale, Calif.

[22] Filed: May 24, 1971

[21] Appl. No.: 146,055

[52] U.S. Cl. ..............................317/33 R, 317/2 R, 317/61, 317/235 R, 307/202

[51] Int. Cl. ........................................H02h 1/04, H05f 3/00

[58] Field of Search ....................317/61, 61.5, 2 R, 33, 235, 317/46.1, 235, 22; 307/202, 303

[56] References Cited

UNITED STATES PATENTS 3,597,640 8/1971 Kubinec..............................317/33 R 3,413,497 11/1968 Atalla....................................317/2 R

*Primary Examiner*—J. D. Miller
*Assistant Examiner*—Harvey Fendelman
*Attorney*—Flehr, Hohbach, Test, Albritton and Herbert

[57] ABSTRACT

An integrated circuit chip has one or more semiconductor devices and one or more bonding pads on the chip. The one or more bonding pads are electrically coupled to the semiconductor devices. A conductor which is adapted to be connected to a reference potential is also disposed on the integrated circuit chip. The conductor has a portion of its periphery in proximity to the portion of the periphery of a bonding pad and cooperates therewith to form a spark gap for protecting the semiconductor devices against electrical discharges. The proximate portions of the peripheries of the bonding pad and the conductor can be rectilinear or formed in tooth-like projections.

12 Claims, 7 Drawing Figures

INVENTORS
LEWIS K. RUSSELL
JAMES L. BANKS
BY Flehr, Hohbach, Test, Albritton & Herbert
ATTORNEYS INVENTORS
LEWIS K. RUSSELL
JAMES L. BANKS
BY Flehr, Hohbach, Test, Albritton & Herbert
ATTORNEYS

MEANS INCLUDING A SPARK GAP FOR PROTECTING AN INTEGRATED CIRCUIT FROM ELECTRICAL DISCHARGE

BACKGROUND OF THE INVENTION

This invention generally pertains to means for protecting an integrated circuit and more particularly pertains to a spark gap for protecting an integrated circuit from electrical discharges.

Integrated circuits and in particular MOS integrated circuits are very susceptible to static electrical discharges. For example, in the past, most of the damage done to MOS integrated circuits prior to their use in a circuit was due to discharge of static electricity which was built up by persons handling the integrated circuits. For a time manufacturers shipped their MOS devices with a metal ring connecting all the terminals of the device together so that any charge which might build up by a person handling the device would leak off through some of the PN junctions of the device and not damage any of the MOS gates.

In the very recent past, a large number of integrated circuit manufacturers have been working on developing circuits to bleed off static electrical discharges. The problem has been, however, that these devices would not bleed the charge off fast enough and were not always capable of handling the magnitude of static electrical build-ups. For example, it is quite common for a static electrical charge to build up to the order of 2,000 or 3,000 volts. Quite small amounts of charge on the order of a few microcoulombs are involved but at these very high potentials many existing protection devices do not adequately handle this type of discharge.

SUMMARY OF THE INVENTION

Accordingly, it is an object of this invention to provide an improved means for protecting integrated circuits against electrical discharge.

Briefly, in accordance with one embodiment of the invention, an integrated circuit chip of the type having one or more semiconductor devices formed therein includes at least one input or output bonding pad. Coupling means are provided for electrically connecting the at least one bonding pad to one of the semiconductor devices. A conductor is also disposed on the integrated circuit chip and is adapted to be connected to a reference potential. The conductor has a portion of its periphery in proximity to a portion of the periphery of the at least one bonding pad and cooperating therewith to form a spark gap.

Additional objects and features of the invention will appear from the following description in which the preferred embodiments of the invention have been set forth in detail in conjunction with the drawings.

DESCRIPTION OF THE PREFERRED EMBODIMENTS

Figure 1:
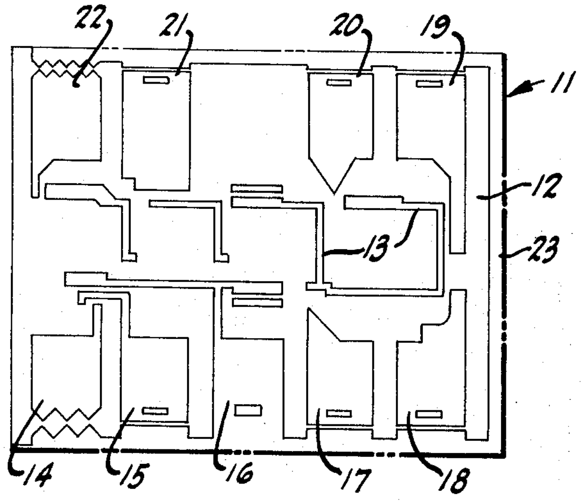
FIG. 1 is a top view of an integrated circuit chip illustrating the metallization pattern thereon incorporating spark gaps in accordance with this invention.

Referring now to FIG. 1 there is shown a top plan view of an integrated circuit chip incorporating the present invention. The integrated circuit chip 11 is a typical semiconductor chip of silicon, for example, in which one or more semiconductor devices are formed by diffusion or other appropriate techniques. A layer of insulating material such as silicon dioxide layer 12 covers the semiconductor body. Appropriate metallization is formed by techniques well known in the art on top of the silicon dioxide layer 12. Such metallization includes, for example, running metallization 13 interconnecting the various semiconductor devices in the integrated circuit chip 11 and metallization forming input or output bonding pads 14 through 22. The metallization also includes scribe line metallization generally indicated by reference numeral 23. This scribe line metallization 23 extends around the periphery of the integrated circuit chip 11 and in accordance with standard techniques of fabricating integrated circuits is typically provided between adjacent semiconductor chips in a semiconductor wafer.

In accordance with this invention, the scribe line metallization 23 is adapted to be connected to ground and one or more of the input or output bonding pads 14 through 22, such as bonding pad 16, for example, may also be formed of continuous metallization with the scribe line metallization so as to be at ground. Further, in accordance with this invention, one or more of the input or output bonding pads has a portion of its periphery adjacent to and separated by a predetermined distance from a portion of the periphery of the scribe line metallization 23. For the sake of illustration, the bonding pads 14, 15 and 17 through 22 are all shown in FIG. 1 as having a portion of their peripheries adjacent to and separated by predetermined distance from portions of the periphery of the scribe lines metallization 23. The proximate portions of the peripheries of the bonding pads and the scribe line metallization cooperate to form spark gaps for protecting the semiconductor devices in the integrated circuit chip 11 against electrical discharges. The proximate portions of the peripheries of the bonding pads and the scribe line metallization can be rectilinear to form a parallel spark gap having maximum cathode and anode areas such as illustrated with respect to bonding pads 15, and 17 through 21 in FIG. 1. In accordance with another embodiment of the invention the proximate portions of the peripheries of the bonding pads and the scribe line metallization can be formed with tooth-like projections as illustrated with respect to bonding pads 14 and 22 in FIG. 1. The tooth-like projections terminate in points and the points of the tooth-like projections on a bonding pad periphery are generally aligned with but spaced a predetermined distance from points on the proximate portion of the periphery of the scribe line metallization. A few aligned large tooth-like projections may be provided as shown with respect to bonding pad 14 in order to provide a few high electric field intensity points for early generation of a spark across the tooth-like projections. Alternatively, such as shown with respect to bonding pad 22, many smaller tooth-like projections can be provided for the possibility of repeated erosions such as transmigration of the tooth-points during successive arcings.

The predetermined distance between the proximate portions of the bonding pad periphery and the scribe line metallization periphery is adjusted so that arcing or spark generation occurs at a potential half way between the highest voltage the bonding pad (such as an input bonding pad) is expected to see in normal operation and the lowest potential at which the semiconductor devices in the integrated circuit chip 11 are damaged. In accordance with specific embodiments of this invention, the predetermined distance has been adjusted to the point where the voltage at which an arc is initiated is around 60 to 80 volts.

Figure 2:
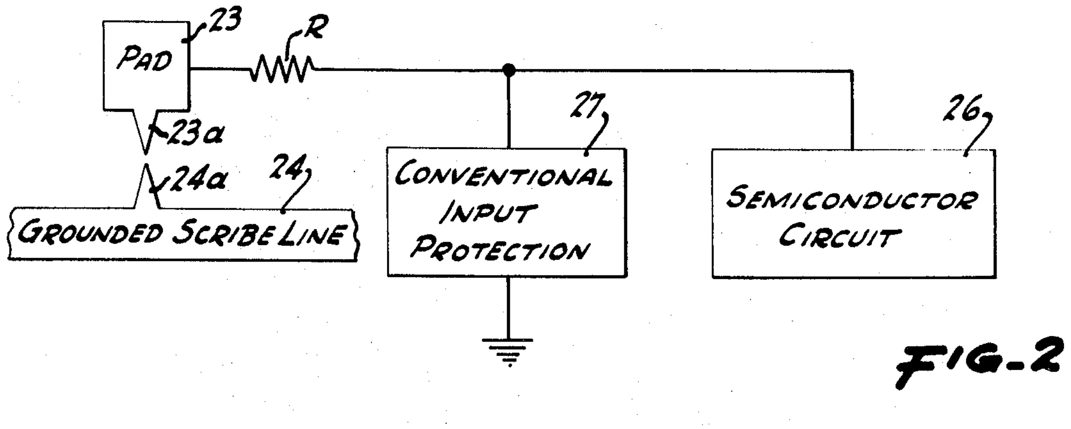
FIG. 2 is an electrical schematic in block diagram form showing the electrical relationship between the semiconductor devices and the input protection arrangements of this invention.

A spark gap in accordance with the present invention is most effective when it is used in combination with other conventional input protection devices. A typical such combination is shown in FIG. 2. A bonding pad 23 which may, for example, be an input bonding pad, has a portion of its periphery formed in tooth-like projections diagrammatically illustrated by tooth portion 23*a*. A grounded scribe line 24 also has a portion of its periphery formed in tooth-like projections generally diagrammatically illustrated by projection 24*a*. The projections 23*a* and 24*a* are adjacent one another and generally aligned but separated by a predetermined distance. The bonding pad 23 is connected through a charge slow-down resistor R to the semiconductor circuit 26 which is to be protected. Conventional input protection devices 27 are connected between the semiconductor circuit 26 which is to be protected and ground. These conventional input protection devices are well known in the art and are designed to protect an integrated circuit at voltages less than 70 or 80 volts. For example, the conventional input protection devices are devices such as diodes, transistors, etc., which have a relatively high voltage threshold which is higher than voltage applied to the semiconductor circuit 26 in normal operation. When this voltage threshold is exceeded the conventional input protection devices 27 become conductive and provide a current path to ground at these higher voltages.

Figure 3:
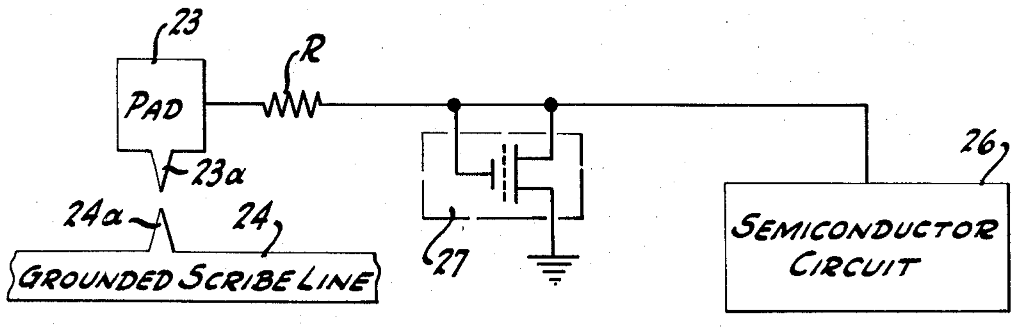
FIG. 3 is an electrical schematic drawing similar to FIG. 2 and showing a thick field MOS gate device which can be used as conventional input protection.

One suitable conventional input protection device 27 is shown in FIG. 3. The conventional input protection device 27 shown in FIG. 3 comprises a thick field MOS gate which in accordance with techniques well known in the art is provided with a silicon nitride layer which functions to raise its voltage threshold to approximately 50 to 60 volts. Specific spark arrangements in accordance with this invention have been tested and have demonstrated a capacity for discharging potentials as high as 5,000 volts and having a total charge of 4 $\times 10^{-6}$ coulombs. These values of voltage and charge generally exceed that condition popularly known as "static charge".

Figure 4:
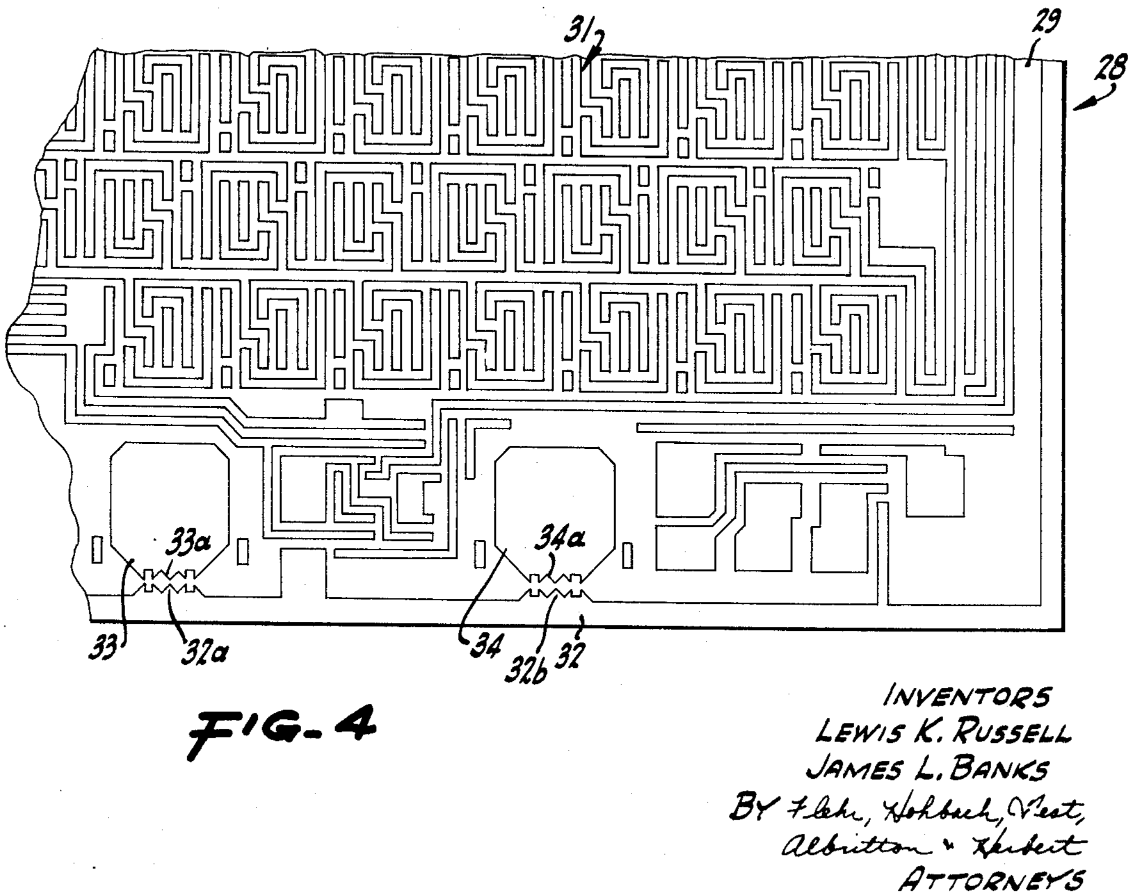
FIG. 4 is a top view of another integrated circuit chip having a spark gap.

FIG. 4 shows a top plan view of another integrated circuit chip incorporating a spark gap in accordance with this invention. The integrated circuit chip 28 has a plurality of semiconductor devices formed therein and is covered with an insulating coating such as silicon dioxide layer 29. Appropriate metallization is formed on top of the silicon dioxide layer 29 and includes running metallization generally indicated by reference numeral 31 for interconnecting the various semiconductor devices. Metallization also includes scribe line metallization 32 which is adapted to be connected to ground and includes one or more bonding pads such as the input bonding pads 33 and 34. The scribe line metallization has portions of its periphery formed in tooth-like projections 32*a* and 32*b*. Input bonding pad 33 has a portion of its periphery 33*a* formed in tooth-like projections which are generally aligned with and spaced a predetermined distance from the tooth-like projections 32*a*. Similarly, the input bonding pad 34 has a portion of its periphery formed in tooth-like projections 34*a* which are generally aligned with but separated a predetermined distance from the tooth-like projections 32*a*. The tooth-like projections 33*a* and the tooth-like projections cooperate to form a spark gap for protecting the semiconductor devices against electrical discharge. Similarly, the tooth-like projections 34*a* and the tooth-like projections 32*b* cooperate to form a spark gap.

Figure 5:
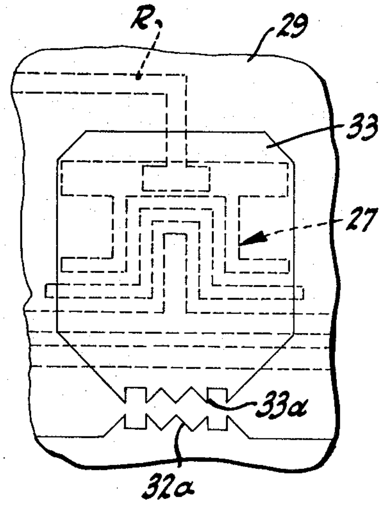
FIG. 5 is an enlargement of a portion of FIG. 4 and illustrating placement underneath an input bonding pad of a resistor and other input protection means for connecting the bonding pad to the semiconductor devices.

Referring to FIG. 5, there is shown an enlarged top plan view of the input bonding pad 33 and illustrating placement in the semiconductor chip 28 underneath the input bonding pad 33 and the layer of silicon dioxide 29 of conventional input protection devices. Thus, illustrated in dotted lines are the diffusions in the semiconductor chip 28 for forming an input protection device 27 which may, as discussed previously, be a thick field MOS gate having a relatively high voltage threshold. The charge slow-down resistor R may also be formed by diffusions in the semiconductor chip 28.

Figure 6:
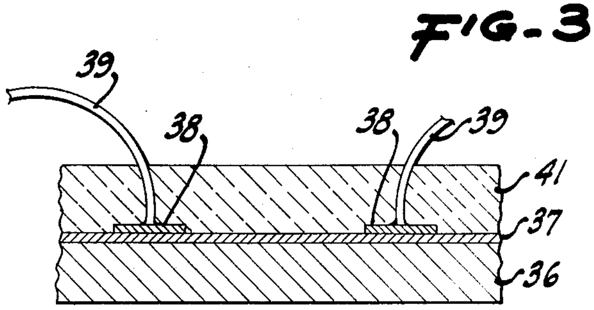
FIG. 6 is a cross-sectional side view of an integrated circuit chip in which, after all connections are made, a layer of glass has been formed on top of the chip.

Input protection means in accordance with this invention drains off large quantities of charge so that the semiconductor circuit proper is not damaged. It does this by creating an electric arc. Also in accordance with this invention the spark gap may be disposed in an environment providing an ionization path between the halves of the spark gap in order that the spark gap be capable of draining off larger quantities of charge at a faster rate. Thus, for example, as shown diagrammatically in FIG. 6, a semiconductor chip 36 has a layer of silicon dioxide 37 disposed thereon along with the appropriate metallization generally indicated by metallization 38. In accordance with standard integrated circuit manufacturing techniques, portions of the metallization 38 are connected to external lead frames or the like (not shown) by wires 39 which, for example, are thermocompression bonded to portions of the metallization 38. A layer of glass or other suitable insulating material can then be formed over the silicon dioxide layer 37 and the metallization 38 to provide a protective covering for protecting the semiconductor chip along with all the semiconductor devices formed therein and the metallization formed thereon. Such a glass layer 41 also functions to provide an ionization path between metallization portions forming a spark gap so that the spark gap is capable of draining off larger quantities of charge at a faster rate than if the portions of the spark gap were simply separated by air.

Figure 7:
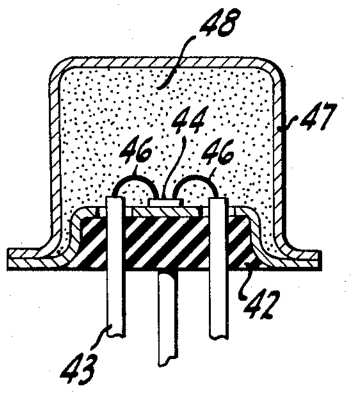
FIG. 7 shows an integrated circuit chip mounted in an airtight enclosure which in this case is a TO5 can.

Referring to FIG. 7 there is shown a side cross-sectional view of packaging means for an integrated circuit. The mounting arrangement in FIG. 7 includes a header 42 having a plurality of leads 43. An integrated circuit chip 44 is mounted to the header and the bonding pads on the integrated circuit chip 44 are connected by means such as wires 46 to the plurality of leads 43. A cover 47 is then thermocompression bonded to the header 42 to form an airtight seal. In accordance with one aspect of this invention, when a packaging arrangement such as shown in FIG. 7 is utilized, the interior of the cover 47 generally indicated by reference numeral 48 is filled with a gas such as, for example, one of the noble gases such as neon or argon. A spark gap disposed in such a gaseous environment is capable of producing a plasma arc for draining off large quantities of charge at a very fast rate.

Thus, what has been described is an improved means for protecting an integrated circuit from electrical discharge. Such means, in accordance with this invention, comprises metallization formed on an integrated circuit chip in a configuration of spark gaps. Such spark gaps can be used alone or can be used in connection with convention input protection devices such as slow-down resistors, etc., for protecting an integrated circuit against electrical discharges. The spark gap may be disposed in an environment having an ionization potential higher than that of air so that ionization paths are formed through the environment enabling the spark gap to handle larger quantities of charge at a faster rate.

We claim:

1. In an integrated circuit chip of the type having one or more semiconductor devices formed therein, input protection means for protecting the one or more semiconductor devices against electrical discharge comprising at least one bonding pad formed on the integrated circuit chip, coupling means connecting said at least one bonding pad to one of the semiconductor devices, a conductor which is adapted to be connected to a reference potential and which is disposed on the integrated circuit chip, said conductor having a portion of its periphery in proximity to a portion of the periphery of said at least one bonding pad and cooperating therewith to form a spark gap.

2. Input protection means in accordance with claim 1 in which said bonding pad comprises metallization and in which said proximate portions of the peripheries of said bonding pad and said conductor are rectilinear.

3. Input protection means in accordance with claim 1 in which said bonding pad and said conductor comprise metallization and in which said proximate portions of the peripheries of said bonding pad and said conductor each have one or more tooth-like projections tapering to a point, the points on said bonding pad periphery being generally aligned with but spaced from the points on said conductor periphery.

4. Input protection means in accordance with claim 1 including a layer of glass formed on the semiconductor chip and functioning to provide an ionization path for facilitating electrical discharge between said bonding pad and said conductor.

5. Input protection means in accordance with claim 1 including an airtight enclosure for the integrated circuit chip, said enclosure being filled with a gas functioning to provide an ionization path for facilitating electrical discharge between said bonding pad and said conductor.

6. Input protection means in accordance with claim 1 in which said coupling means includes a charge slow-down resistor formed in the integrated circuit chip for limiting current surges to the one or more semiconductor devices.

7. Input protection means in accordance with claim 1 in which said coupling means includes a current conducting device having a relatively high voltage threshold connected between the one or more semiconductor devices and reference potential for cooperating with the spark gap to provide a discharge path for electrical surges.

8. Input protection means in accordance with claim 7 in which said current conducting device comprises a thick field MOS gate.

9. Input protection means in accordance with claim 3 including a layer of glass formed on the semiconductor chip and functioning to provide an ionization path for facilitating electrical discharge between said bonding pad and said conductor.

10. Input protection means in accordance with claim 3 including an airtight enclosure for the integrated circuit chip, said enclosure being filled with a gas functioning to provide an ionization path for facilitating electrical discharge between said bonding pad and said conductor.

11. Input protection means in accordance with claim 3 in which said coupling means includes a charge slow-down resistor formed in the integrated circuit chip for limiting current surges to the one or more semiconductor devices and includes a current conducting device having a relatively high voltage threshold connected between the one or more semiconductor devices and reference potential for cooperating with the spark gap to provide a discharge path for electrical surges.

12. Input protection means in accordance with claim 11 in which said current conducting device comprises a thick field MOS gate.

* * * * *